United States Patent [19]

Labus

[11] 4,379,260

[45] Apr. 5, 1983

[54] DUAL-SLOPE INTEGRATOR

[75] Inventor: Herwig Labus, Jülich, Fed. Rep. of Germany

[73] Assignee: Kernforschungsanlage Jülich GmbH, Jülich, Fed. Rep. of Germany

[21] Appl. No.: 105,670

[22] Filed: Dec. 20, 1979

[30] Foreign Application Priority Data

Dec. 21, 1978 [DE] Fed. Rep. of Germany ....... 2855282

[51] Int. Cl.³ ............... G01R 17/06; H03K 13/20
[52] U.S. Cl. .................. 324/99 D; 324/111; 340/347 NT; 340/347 AD
[58] Field of Search ............... 324/99 D, 111; 340/347 NT, 347 AD; 328/127

[56] References Cited

U.S. PATENT DOCUMENTS 3,840,807 10/1974 Zschimmer .............. 324/99 D
3,895,376 7/1975 Uchida .................... 340/347 NT
4,082,998 4/1978 Marriott .................. 340/347 NT

OTHER PUBLICATIONS

Walton, C. A.; "Triple Ramp..." *IBM Tech. Dis. Bull.;* vol. 11; No. 4; Sep. 1968; p. 384.

*Primary Examiner*—Ernest F. Karlsen
*Attorney, Agent, or Firm*—Karl F. Ross

[57] ABSTRACT

A dual-slope integrator is provided in the usual manner with input switches for a measured voltage and reference voltage and with a first counter having a count capacitor $N_1$, in addition to the usual integrating resistor and integrator condenser in circuit with an integrating amplifier. The output of the latter is applied to a comparator and a clock-pulse generator produces the counting pulses. According to the invention, a second counter is provided with a capacitor $N_2$ so that the two counters together have a capacity $N_1 \times N_2$, the input switching circuit is keyed by the clock pulses, and a further amplifier of amplification $N^*_2$ is provided, the amplification factor $N^*_2$ being approximately equal to $N_2$. The latter amplifier is connected to a holding condenser through a further switch which is triggered in the cadence of the clock pulses to eliminate instabilities resulting from temperature dependent and transient factors in the otherwise conventional dual-slope integrator.

6 Claims, 3 Drawing Figures

DUAL-SLOPE INTEGRATOR

FIELD OF THE INVENTION

My present invention relates to a dual-slope integrator and, more particularly, to a dual-slope integrator free from temperature dependency and transient switch effects or instability.

BACKGROUND OF THE INVENTION

Dual-slope integrators are widely used in electrical circuits for measuring and display purposes, e.g. to integrate an input signal which may result from a measurement of a physical parameter or to facilitate the display of a physical parameter translated into an integratable electrical signal on an oscilloscope or other recording medium. Such circuits are used in threshold devices to trigger emergency, warning or other indicating outputs and/or to control processes in response to a physical parameter whose value is translatable into the input signal.

It is known to provide a dual-slope integrator with measured-voltage and reference voltage inputs, an integrating resistor/capacitor/operational amplifier, a comparator connected to the integrating amplifier circuitry to monitor the voltage on the integrating condenser, a clock-pulse generator for producing counting pulses and a counter with a given capacity, e.g. $N_1$, for counting these pulses. Such circuits are also provided with logic networks and gating stages receiving the clock pulses. The gating stage is controlled by the output of the comparator as are the input switches which deliver the measured voltage and the reference voltage to the system. Conventional dual-slope integrators having these circuit elements connected in the manner described, have several significant disadvantages:

Firstly, the comparator connected to the integrator generates, because of its noise, a time-perturbation effect which, as a consequence of the larger band width of the comparator, is greater than the time perturbation effect resulting from the integration noise, thereby multiplying the effect of transience.

Secondly, the technologically reliable band width and amplification product of the comparator, because of the limited rise velocity of the signal at its input, results in a delay of the comparator signal of up to several microseconds. This transmission delay is highly temperature dependent and has poor long-term stability. It limits the resolution to values less than $10^4$ with 2 milliseconds integration time.

Thirdly, because of parasitic capacitances, the integrator output signal has sharp peaks superimposed thereon at the flanks of the clock pulses to produce a faulty response of the comparator.

Fourthly, the two field-effect transistor-input switches, which first apply the input voltage and then the reference voltage to the integrator, naturally generate parasitic charge surges during their switching operations. These surges cannot be effectively compensated within a measuring cycle where three switchovers are effected up to a cutoff of the pulse counter.

Finally, the switching times of the field-effect transistor-input switches of about 1 microsecond are temperature dependent and of poor long-term stability. These switching times limit, as does the comparator delay, the upper limit of the resolution capability and the lower limit of the measuring time.

OBJECTS OF THE INVENTION

It is the principal object of the present invention to provide a dual-slope integrator avoiding the drawbacks of the earlier described circuits of this type.

Another object of the present invention is to provide a dual-slope integrator which is free from certain disadvantages of prior-art circuits, especially detrimental effects caused by the use of a comparator.

Another object is to increase the resolution capability of a dual-slope integrator.

SUMMARY OF THE INVENTION

These objects and others which will become apparent hereinafter are attained, in a dual-slope integrator which, as in the art-recognized circuits, comprises input switches for the measured voltage and reference voltage, an operational amplifier, referred to hereinafter as an integrating amplifier, connected with an integrating resistor and an integrating condenser, and a comparator for monitoring the voltage of the integrating condenser, the circuit further including a first counter with a count capacity $N_1$ and a clock-pulse generator for producing the count pulse.

According to the invention, the control circuit for the switching stages is keyed by the clock pulses, a second counter of a second capacity $N_2$ is connected in circuit with the first counter to form a count of a total capacity $N_1 \times N_2$, a holding condenser is connected to the output of the integrating capacitor via a second amplifier with an amplification factor of $N^*_2 \simeq N_2$ and a respective switch (holding condenser charge switch or third switch), and the holding condenser is connectable to the input of the integrator via still another switch (fourth switch).

The logic circuitry and the clock-pulse generator are so dimensioned that these switches are triggered by the first zero passage of the reference voltage so that the residual potential of the integrating amplifier is amplified by the factor $N^*_2$ for a second measuring cycle and a feedback to the input while simultaneously both switches are switched successively to produce in the further measuring cycle a count state in the counters determined by the reference voltage. In the above summary, the first and second switches can be the two input switches for the measured signal and the reference signal, respectively. Throughout this description, reference will be made to "switches" and it should be understood that in general such switches will be electronic solid state switches such as transistors which can be triggered between open or unblocking states to closed or blocking states, respectively.

While the advantages of this system over the art will, in large measure, be readily recognized, it should be pointed out that the claimed arrangement distinguishes from earlier dual-slope integrators in that the switchover of the counting pulse during the integration of the reference voltage is effected during a time-stable flank of a clock pulse.

According to a feature of the invention, the values of the circuit elements, such as the resistance R of the integrating resistor, the capacitance C of the integrating condenser, the frequency f of the clock pulse generator and the amplification factor $N^*_2$ correspond to the relationship $$\frac{R.C.f}{N_2^*} = 1$$

This allows determination of the signal values in particularly simple manner without additional calculation.

According to yet another feature of the invention, disturbance pulses can be suppressed in that the logic control circuit for switching the clock pulse includes a delay circuit whose output switching pulse has a predetermined delay relative to the flank of the clock pulse generator signal following the zero passage of the comparator.

This fixed delay is selected to be greater than the width (duration) of disturbance pulses.

A fixed pulse count, corresponding to this delay time, is subtracted from the counter by increasing the backward count at the end of the second measuring cycle.

Preferably the switching times are made independent of disturbance voltages and the switching times of the input switch system by providing between the integrator resistance and the virtual or apparent current of the integrator, still another switch (a fifth switch) which exclusively establishes the beginning and ending instants of the integration cycle.

The latter switch is advantageously a bridge circuit of rapid-switching diodes.

Since the integration is independent of the transient time of the operational amplifier, the integrator according to the present invention is provided with a voltage-controlled current source whose output can be connected to the rapid-acting bridge circuit and the integrating condenser in series therewith.

Because of this construction, the rapid-acting bridge circuit is unblocked when all transient processes of the current source and the input switch have decayed.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 2:
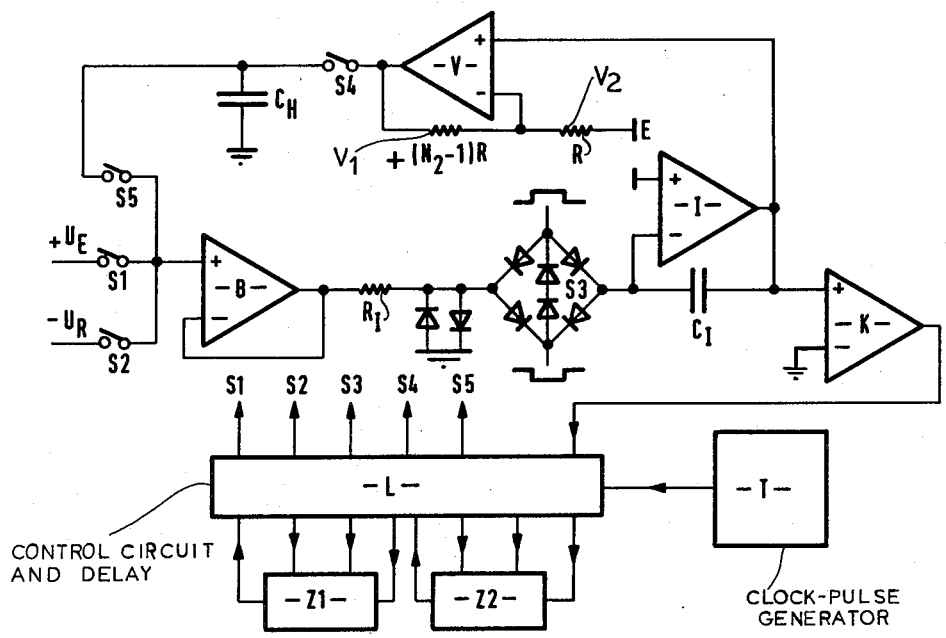
FIG. 2 is a circuit diagram, partially in block form and with the switches represented diagrammatically, rather than as solid state units, of a dual-slope integrator embodying the present invention.

FIG. 2 shows a dual-slope integrator which will be understood to have field-effect transistor-input switches S1 and S2 which are controlled by the control circuit L to switch the measuring voltage $U_E$ and the reference voltage $U_R$, respectively.

These (first and second) switches are connected to the input of an isolating amplifier B which has a feedback path enabling this amplifier to operate as an operational amplifier.

The operational amplifier B is connected through a series integrating resistor R and a rapid-action bridge switch S3 (fifth switch) with an integrating condenser $C_I$. The rapid-action bridge switch is formed from hot-carrier diodes and is controlled by a potential-free signal source.

Integration is effected by the network $R_I$, $C_I$ and the operational amplifier I, referred to hereinafter as an integrating amplifier.

The output of the integrating condenser $C_1$ is applied to a comparator K whose output is applied to the control circuit L.

A cadence generator, in the form of a clock pulse generator or square-wave oscillator T is also connected to the control circuit L.

Two counters Z1 and Z2 are also connected to the control circuit L and have respective counting capacities $N_1$ and $N_2$ so that the two counters Z1 plus Z2 together have a total capacity of $N_1 \times N_2$.

The output of the integrating condenser $C_I$ is connected to an amplifier V having an amplification factor $N^*_2 = N_2$. The dimensions of the feedback resistor V1 and the biasing resistor V2 are given in FIG. 2. Thus if the ohmic value of resistor V2 is R, the value of resistor V1 is $(N_2-1)R$.

The output of the amplifier V is applied to the holding condenser $C_H$ through a triggerable solid state switch S4 (third switch) and the potential of this condenser $C_H$ can be applied through another solid state switch S5 (fourth switch) to the amplifier B and hence to the input of the integrator.

The switches S1–S5 are all controlled by the logic circuit L in the sequence set forth below with reference to FIG. 1.

First Measuring Cycle:

1.1 The unknown input voltage $U_E$ is applied to the integrator input and is integrated until overflow of the first counter with the value $N_1$. $N_1$ is an integral power of the base 10 or the base 2.

1.2 The reference voltage $-U_R$ is applied by switch S2 to the integrator input and counter Z1 is simultaneously started.

Figure 1:
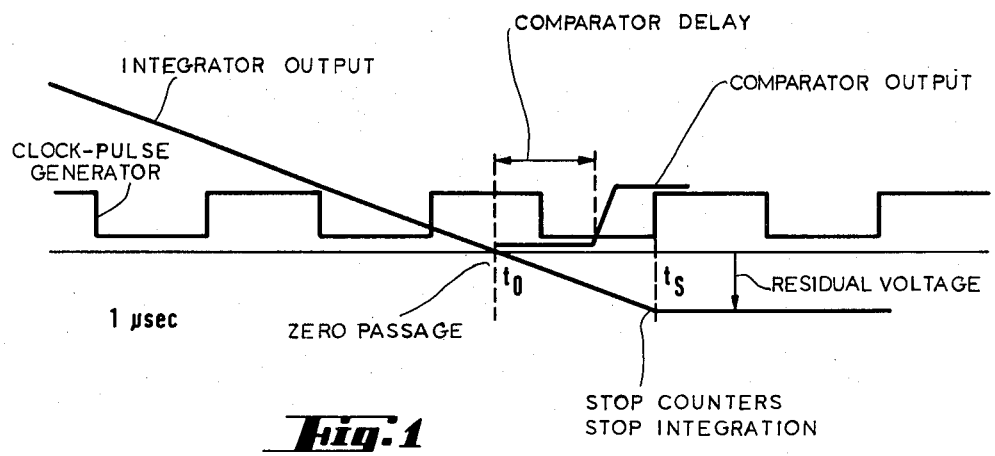
FIG. 1 is a diagram of the integrator output voltage, the clock pulse output and the zero passage of the system of the present invention, the amplitude being plotted along the ordinate and time being plotted along the abscissa.

1.3 The counter Z1 is stopped, not as is conventional in the art by the comparator output signal, but by the flank of the clock generator pulse following the comparator output, i.e. at the moment $t_S$ represented in FIG. 1, thereby opening switch S2, terminating the application of the reference voltage and retaining the instantaneous count $Z_1$ in counter Z1.

1.4 The residual voltage at the integrator output ($U_R$ in FIG. 1) is amplified by the factor $N^*_2 = N_2$ wherein $N_2$ is an integral power of the base 10 or of the base 2, the amplified value being stored in the holding circuit.

Second Measuring Cycle:

2.1 The residual voltage amplified by the factor $N^*_2$ is applied to the integrator input (switch S5 is closed) and is integrated until overflow of the second counter Z2 with a maximum capacity of $N_2$.

2.2 The output of counter Z2 is connected with the input of counter Z1 so that in the thus formed counter $Z3 = Z1 + Z2$ with an overflow value $N_1 \times N_2$, the contents $Z_1$ of the first measuring cycle is multiplied by the factor $N_2$.

2.3 The counter Z3 is switched to its backward count and the reference voltage applied to the integrator input and the counter Z3 is started.

2.4 The counter Z3 is stopped as described under 1.3 with contents of $[Z_1 \times (N_2 - Z_2)]$.

In a conventional dual-slope integrator the relationship between the input voltage $U_E$ and the contents Z of the single counter at the end of the measuring cycle is determined by the relationship $$U_E = U_R \cdot \frac{Z}{N} \quad (1)$$

Where $U_R$ is the reference voltage, N is the maximum count to overflow of the counter.

This relationship can be can be transformed, for the single signal processing step into the relationship (for the present invention)

$$U_E = U_R \cdot \frac{(Z_1 \cdot N_2 - Z_2 \cdot F)}{N_1 \cdot N_2} \text{ wherein } F = \frac{R.C.f}{N_2^*} = 1. \quad (2)$$

In this relationship $U_E$ is the unknown input voltage, $U_R$ the reference voltage, $N_1$ and $N_2$ are the maximum counts to overflow of the counters Z1, Z2, $Z_1$ and $Z_2$ are the actual count states of the counters Z1 and Z2 during the reference voltage integration of the first and second cycles, F is a product of the integrating resistance R, the integrating capacitance C, the clock frequency f and the amplification factor $N^*_2$ of the residual voltage from the first measuring cycle.

The coefficient $A = Z/N$ from equation (1) is replaced in equation (2) by the complex coefficient $$B = (Z_1 \cdot N_2 - Z_2 \cdot F)/(N_1 \cdot N_2).$$

Consequently:

A. The coefficient B is determined directly and in the described manner within the circuit. Multiplication and subtraction processes in separate circuit elements can be eliminated.

B. The factor F in coefficient B must be 1.0 so that $U_E$ is proportional to $Z_1 \times N_2 - Z_2$ which is the count at the end of the second cycle in the backwards counting counter Z3. By appropriate choice of the values R, C, f and $N^*_2$, however, F can be made 1.0 in a simple manner.

C. The factor F is temperature independent and has no long-term stability. Its effect on the stability of the measured value, however, can be seen from equation (2) to be $$\frac{dU_E}{U_E} = \frac{dF}{F} \cdot \frac{1}{N_1} \quad (3)$$

In the latter equation $N_1$ is the overflow value of counter Z1 from the first measuring cycle and dF/F the relative drift of the analog values.

Equation 3 shows that the relative change $dU_E/U_E$ of the measured value $U_E$ is $N_1$ smaller E than the relative drift of F.

Where $N_1$ equals 100 and dF/F equals 0.01, a value which can be achieved with conventional circuit elements, the relative instability of the measured value is a factor of $10^{-4}$. As $N_1$ is raised to still higher orders of magnitude and dF/F reduced to 0.001, which is also readily attainable, it can be seen that the relative instability becomes vanishingly small.

The dual-slope integrator of FIG. 2 thus has the following significant advantages:

1. The use of two measuring cycles reduces measuring time of the dual-slope integrator. From equation (2) it can be seen that the total resolution of the system amounts to $N_1 \times N_2$ while the maximum clock count for two cycles with full performance is only $2 \times (N_1 + N_2)$.

For a similar resolution of $N_1 \times N_2$ in a conventional dual-slope integrator the clock pulse requirement is $2 \times N_1 \times N_2$. For example, with a resolution of $10^4$ and a clock frequency of 200 kHz, a measuring time of 100 millisecond is required for a full operation while the same resolution and clock frequency the measurement is completed in 2 millisecond. When $N_1 = N_2 = 100$ the measuring time is thus sharply reduced.

2. All of the detrimental effects of the comparator are eliminated. From FIG. 1 and the discussion on the point 1.3 above, it will be observed that the interruption of the reference voltage integration is not affected as in the prior art systems by comparator information which may not be stable with time but by the highly stable cadence of the clock pulse generator. Unstable signal delays and noise in the comparator cannot affect the measurement and first and second disadvantages of the conventional dual-slope integrators as described above, are completely removed.

3. The third major disadvantage as mentioned above can also be seen to be eliminated where the counter Z1 in the first measuring cycle is stopped by a pulse which has a fixed delay relative to the comparator signal-following flank from the clock pulse generator where the delay is greater than the width of the spikes which are generated by parasitic capacitances during each flank of the clock pulse generator signal application. This delay corresponds to a fixed pulse count by which the duration of the backward count of counter Z3 is subtracted at the end of the second measuring cycle. The delay network is included in the control circuit L. The cutoff of the reference voltage and the locking of the residual voltage thus does not occur at a point at which a disturbance spike can be found at the integrator output.

This also eliminates the fourth significant disadvantage of prior art dual-slope integrators.

The rapid-action bridge switch S3 which is located ahead of the virtual ground of the integrator, closes under the control of the clock pulse generator only after the transient time of the measuring voltage at the input has fully decayed and opens before the application of the reference voltage to the input. It again closes in the cadence of the clock pulse generator after this switching process has fully decayed and is again opened by the clock pulse signal following the comparator signal. The integrator thus during one measuring cycle is controlled by this switch for the input voltage integration and for the reference voltage integration with two exactly compensating charge peaks so that no measurement error occurs.

Furthermore, the parasitic charge coupling to the integrator usually expected with conventional dual-slope integrators form the different gate-lowering cpacitances of the field-effect transistors, are eliminated because there is no uneven number of switch operations during a measuring cycle.

The final disadvantage outlined above of conventional dual-slope integrators is eliminated by the rapid-acting switch diodes used in the bridge circuit.

In practice it is found that the relatively high switching times of field-effect transistors in the mocrosecond range can be replaced by the substantially shorter switching times of a bridge of rapidly switching diodes in the nanosecond range. Amplitudes of about ±1 volt of the switching voltage can open and close a bridge of such hot-carrier diodes having one side connected to the virtual ground of the integrator.

Because of the small amplitudes used for switching, by comparison with approximately 10 volts for the field-effect transistors of prior art, the reproducibility and efficiency are sharply increased. The bridge circuit can be automatically compensated which is not the case with field-effect transistor switches.

Since the bridge switch can operate at values less than 1 nanosecond, resolution in the first measuring cycle of $10^4$ nanoseconds equals 10 microseconds allows the resulotion to be $10^4$. The total measuring time of both cycles, including the transient time for the compensation can be less than 100 microseconds with a clock pulse frequency of only 10 MHz.

Figure 3:
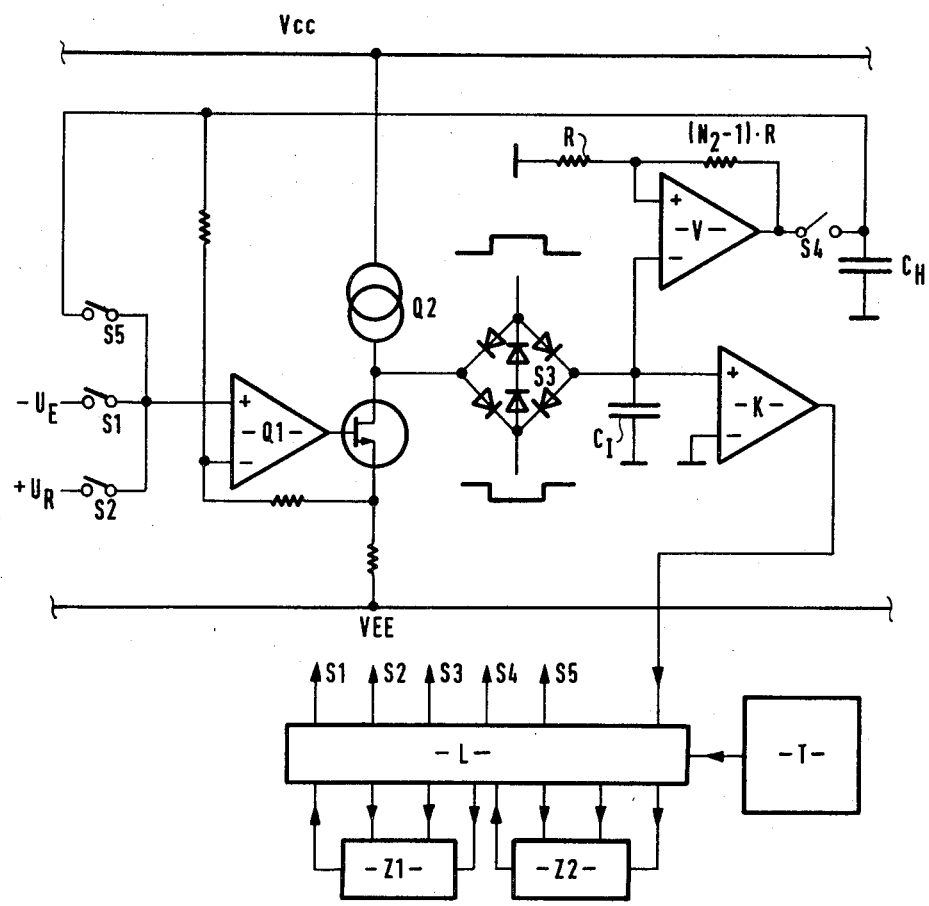
FIG. 3 is a view similar to FIG. 2 of another embodiment of a dual-slope integrator according to the invention.

When extremely short conversion times are to be provided the circuit of FIG. 2 must have a switch S3 and an integrator I capable of switching and transient times in the nanosecond range. This is not possible with conventional monolithic amplifiers of the present time. It is desirable, therefore, to provide an integrating process which is independent of the transient time of the operational amplifier. Such an arrangement has been shown in FIG. 3. In this dual-slope integrator a voltage-control current source Q1 working into a transistor, is employed. The circuit is shown without the compensating and polarity reversal systems for ease in understanding.

In this circuit, Q2 represents a fixed-current source while the other circuit elements correspond to those of FIG. 2. It should be apparent that the charging or discharging times of the capacitor $C_I$ which is grounded on one side, is controlled only by the switching state of switch S3 and transient times of the active integrator no longer affect the charging of the capacitor $C_I$. The role of the integrating resistor is here played by the transistor T1 and the feedback resistor is amplifier Q1.

I claim:

1. A dual-slope integrator comprising:
   an integrating network including an integrating capacitor;
   first and second switches respectively triggerable to apply a measurement voltage and a reference voltage to an input of said integrating network;
   a control circuit connected to said switches for triggering same;
   a clock pulse generator connected to said control circuit for triggering said switches in the cadence of the clock pulses of said generator;
   a first counter having a count capacity $N_1$ and a second counter having a count capacity $N_2$ connected to said control circuit for counting clock pulses during integration of said voltages, said clock pulse generator being connected to said counters by said control circuit upon application of a signal thereto;
   an amplifier having an amplification factor $N^*_2 \simeq N_2$ connected to said integrator capacitor and having an output;
   a third switch connected between said output of said amplifier and a terminal of a holding capacitor, said third switch being triggerable by said control circuit;
   a fourth switch connected between said terminal of said holding capacitor and said input of said integrating network and triggerable by said control circuit; and
   a comparator connected in parallel with said amplifier to said integrating network and controllingly coupled with said control circuit to apply said signal thereto and so that said holding capacitor is connected to said input of said integrating network to apply a residual voltage of the integrating network amplified by the factor $N^*_2$ to the integrating network after the first zero passage of the reference voltage and simultaneously form a combined count in said counters of a value $Z_1 \times N_2 - Z_2$ under the control of the reference voltage where $Z_1$ and $Z_2$ are the counts in the first and second counters respectively, said control circuit being provided with a delay for triggering said third and fourth switches following the zero passages of the comparator output beyond the subsequent flank of a clock pulse by a fixed delay greater than the width of disturbance pulses, said delay corresponding to a fixed pulse count increasing the backward count in the combined counters, said reference voltage being the same for each control of the formation of said combined count.

2. The dual-slope integrator defined in claim 1 wherein said integrating network includes an integrating resistor of resistance R and an integrating amplifier, said integrating condenser has the capacitance C and said clock pulse generaor has a frequency f; R, C and f corresponding to the relationship $$\frac{R.C.f}{N_2^*} = 1.$$

3. The dual-slope integrator defined in claim 2 wherein between said integrating resistor and a virtual ground of the integrating amplifier a fifth switch is provided for exclusively controlling the beginning and end of integrating cycles.

4. The dual-slope integrator defined in claim 3 wherein said fifth switch is a bridge circuit of rapidly switching diodes.

5. The dual-slope integrator defined in claim 4 wherein said integrating network includes a voltage controlled current source.

6. The dual-slope integrator defined in claim 5 wherein said bridge circuit is provided and is switched into conducting relationship when all transient processes of the current source and said first and second switches have decayed.

* * * * *